United States Patent
Tanaka et al.

[11] Patent Number: 6,138,698
[45] Date of Patent: Oct. 31, 2000

[54] ULTRASONIC CLEANING APPARATUS

[75] Inventors: Hiroshi Tanaka, Kurume; Shigenori Kitahara, Chikugo; Kokichi Hiroshiro, Miyaki-gun, all of Japan

[73] Assignee: Tokyo Electron Limited, Tokyo, Japan

[21] Appl. No.: 09/196,010

[22] Filed: Nov. 19, 1998

[30] Foreign Application Priority Data

Nov. 20, 1997 [JP] Japan .................................. 9-334866
Jan. 13, 1998 [JP] Japan .................................. 10-018133

[51] Int. Cl.$^7$ ............................................. B08B 3/12
[52] U.S. Cl. ................................... 134/184; 134/902
[58] Field of Search .................................. 134/182, 184, 134/186, 902, 1, 1.3

[56] References Cited

U.S. PATENT DOCUMENTS

| | | | |
|---|---|---|---|
| 4,955,402 | 9/1990 | Miranda | 134/186 X |
| 5,090,432 | 2/1992 | Bran | 134/184 X |
| 5,409,594 | 4/1995 | Al-Jiboory et al. | 134/1 X |
| 5,698,038 | 12/1997 | Guldi et al. | 134/1 |
| 5,911,232 | 6/1999 | Mokuo et al. | 134/184 |

FOREIGN PATENT DOCUMENTS

| | | | |
|---|---|---|---|
| 244124 | 10/1991 | Japan | 134/184 |
| 246939 | 11/1991 | Japan | 134/902 |
| 2237504 | 5/1991 | United Kingdom | 134/1 |

*Primary Examiner*—Philip R. Coe
*Attorney, Agent, or Firm*—Morrison & Foerster

[57] ABSTRACT

An ultrasonic cleaning apparatus has an intermediate tank having a space divided into a liquid storing region (2a) and a liquid recovering region (2b) by a partition plate (5). An ultrasonic unit (3) is disposed in the bottom of the liquid storing region (2a). A vibration propagating liquid, such as pure water, is contained in the liquid storing region (2a) and a lower part of a cleaning tank (1) is immersed in the vibration propagating liquid stored in the liquid storing region (2a). The partition plate (5) is provided in its upper edge (5c) with a plurality of V-shaped notches (9). A nozzle pipe (4) provided with a plurality of nozzle holes (4a) is disposed in a side of the liquid storing region (2a) opposite a side in which the partition plate (5) is disposed. Pure water jetted by the nozzle pipe (4) toward the outer surface (1a) of the bottom wall of the cleaning tank (1) flows along the outer surface (1a) and overflows the partition plate (5) into the liquid recovering region (2b).

15 Claims, 12 Drawing Sheets

ULTRASONIC CLEANING APPARATUS

BACKGROUND OF THE INVENTION

1. Field of the Invention

The present invention relates to an ultrasonic cleaning apparatus. More specifically, the present invention relates to an ultrasonic cleaning apparatus for cleaning a workpiece, such as a glass substrate for a LCD by the agency of ultrasonic waves.

2. Description of the Related Art

A cleaning method which immerses workpieces (objects to be treated), such as semiconductor wafers or a glass substrates for LCDs, sequentially in cleaning liquids, such as chemical solutions and rinsing liquids, contained in cleaning tanks is employed prevalently in a semiconductor device fabricating process.

Figure 12:
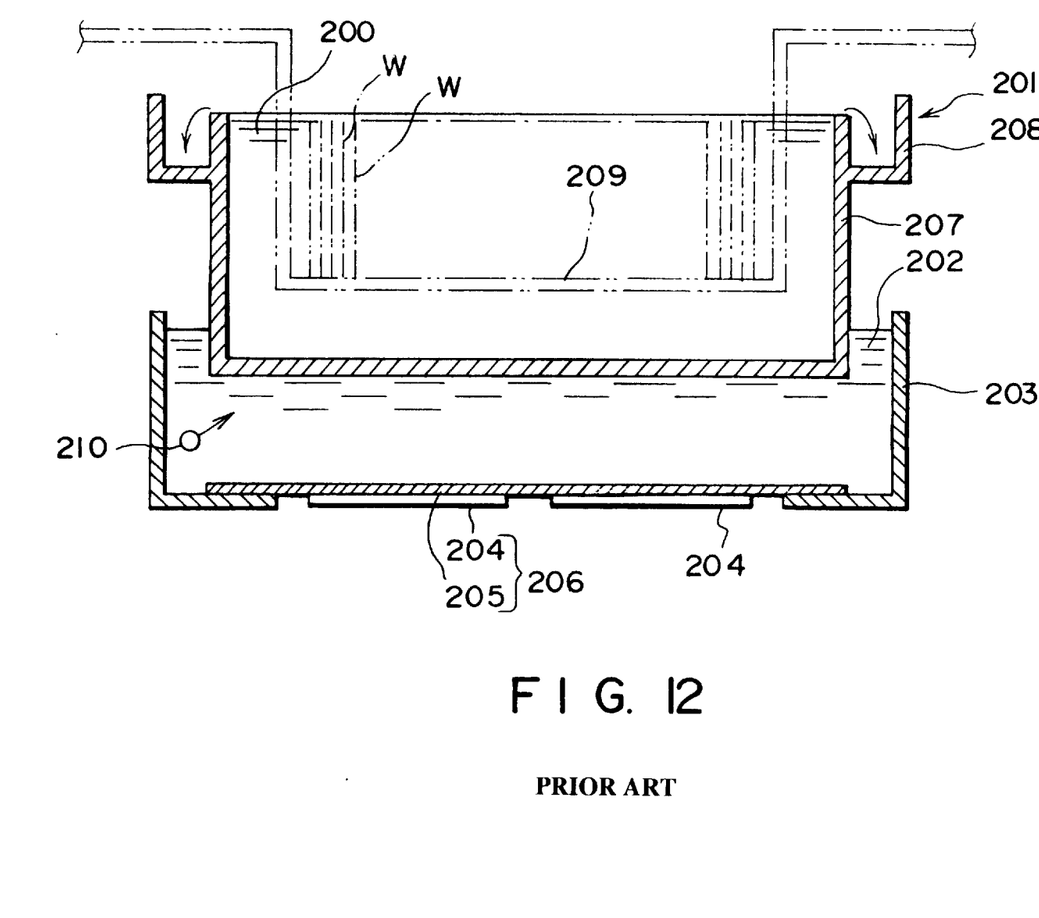
FIG. 12 is a schematic sectional view of a conventional cleaning apparatus.

An ultrasonic cleaning apparatus is employed in carrying out such a cleaning method. As shown in FIG. 12, a conventional ultrasonic cleaning apparatus comprises a cleaning tank 201 containing a cleaning liquid, such as a chemical solution 200, in which workpieces, such as semiconductor wafers W are immersed, an intermediate tank 203 containing pure water 202 in which a lower part of the cleaning tank 201 is immersed, and an ultrasonic generator 206 disposed at the bottom of the intermediate tank 203 and having a vibrating plate 205 and transducers 204 attached to the lower surface of the vibrating plate 205. The cleaning tank 201 comprises an inner tank 207 containing the chemical liquid 200 for actual cleaning of wafers W, and an outer tank 208 surrounding an open upper end part of the inner tank 207 to contain the chemical liquid 200 overflowed the inner tank 207.

Wafers W held in a wafer guide 209 are immersed in the chemical liquid 200 contained in the inner tank 207. Ultrasonic vibrations generated by the ultrasonic generator 206 are transmitted by the pure water 202 contained in the intermediate tank 203 to the chemical liquid 200 to shake particles and the like adhering to the wafers W off the wafers W by the ultrasonic vibrations.

If bubbles generated by the vibration of the transducers 204 adhere to the lower surface of the cleaning tank 201, ultrasonic wavers are reflected. Consequently, the efficiency of propagation of the vibrations to the chemical liquid 200 contained in the cleaning tank 201 is lowered, which may possibly reduce the cleaning ability of the ultrasonic cleaning apparatus. In the conventional ultrasonic cleaning apparatus, a nozzle 210 called a bubble eraser is disposed in the intermediate tank 203 and the pure water 202 is supplied through the nozzle 210 into the intermediate tank 203 so that the pure water 202 will overflow the intermediate tank 203 to remove bubbles from the lower surface of the cleaning tank 201.

If the pure water 202 starts overflowing the intermediate tank 203 at a part of its brim, the pure water 202 will not overflow the intermediate tank 203 at other parts of the brim of the intermediate tank 203 owing to the viscosity and surface tension of the pure water 202. Consequently, local currents of the pure water 202 are produced in the intermediate tank 203 and the pure water 202 stagnates in some parts in the intermediate tank 203, so that the bubbles adhering to the lower surface of the cleaning tank 210 cannot satisfactorily be removed.

Such a problem may be solved by inclining the lower surface of the cleaning tank 201 or by supplying pure water at an increased rate into the intermediate tank 203. However, there is a limit to the inclination of the lower surface of the cleaning tank 201 and the lower surface of the cleaning tank 201 cannot be inclined at an inclination sufficient to remove bubbles satisfactorily. Although bubbles can be removed to some extent by increasing the flow rate of the pure water, bubbles cannot completely be removed by such a means. Furthermore, increase in the flow rate of the pure water 202 entails disadvantageously increase in the amount of waste water.

SUMMARY OF THE INVENTION

Accordingly, it is an object of the present invention to remove bubbles adhering to the lower surface of a cleaning tank without increasing the flow rate of a vibration propagating liquid for the improvement of cleaning efficiency.

With the foregoing object in view, the present invention provides a cleaning apparatus which includes: a cleaning tank for containing a cleaning liquid for cleaning an object, said cleaning tank including a bottom wall having an outer surface; an intermediate tank for storing a vibration propagating liquid in which a lower part of the cleaning tank is immersed, said intermediate tank having a first side and a second side opposed to each other, said intermediate tank being provided with a discharging part at the first side thereof so as to cause the vibration propagating liquid to flow out of the intermediate tank; an ultrasonic generating means provided at the intermediate tank to exert ultrasonic vibrations on the vibration propagating liquid; and a vibration propagating liquid supplying means disposed in the second side of the intermediate tank so as to supply the vibration propagating liquid toward the first side of the intermediate tank.

According to second aspect of the present invention, a cleaning apparatus is provided which includes: an intermediate tank having a plurality of side walls; a partition wall for partitioning the intermediate tank into a first region for storing a vibration propagating liquid therein and a second region for receiving the vibration propagating liquid flowing out from the first region; a cleaning tank having a bottom portion and capable of containing a cleaning liquid for cleaning an object; a ultrasonic generating means provided at the first region of the intermediate tank so as to exert ultrasonic vibrations on the vibration propagating liquid; and a vibration propagating liquid supplying means disposed at a position opposite to the partition wall in the first region of the intermediate tank so as to supply the vibration propagating liquid toward the partition wall; wherein the vibration propagating liquid flows out from the first region to the second region via the partition wall.

Other features and advantages of the present invention will become more apparent from the following description taken in connection with the accompanying drawings.

DESCRIPTION OF THE PREFERRED EMBODIMENTS

Preferred embodiments of the present invention will be described hereinafter with reference to the accompanying drawings.

Figure 1:
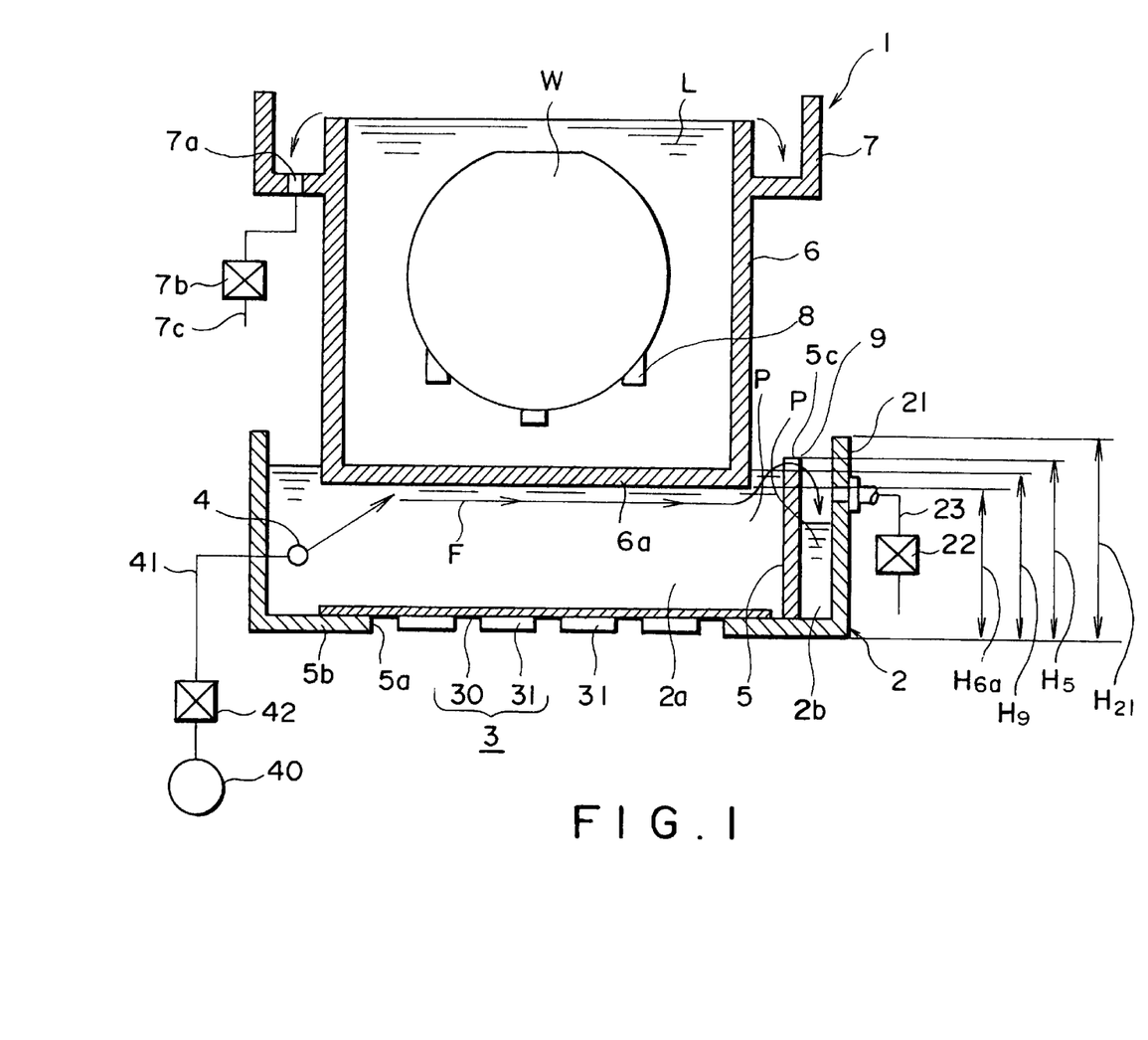
FIG. 1 is a schematic sectional view of an ultrasonic cleaning apparatus in a first embodiment according to the present invention.
Figure 2:
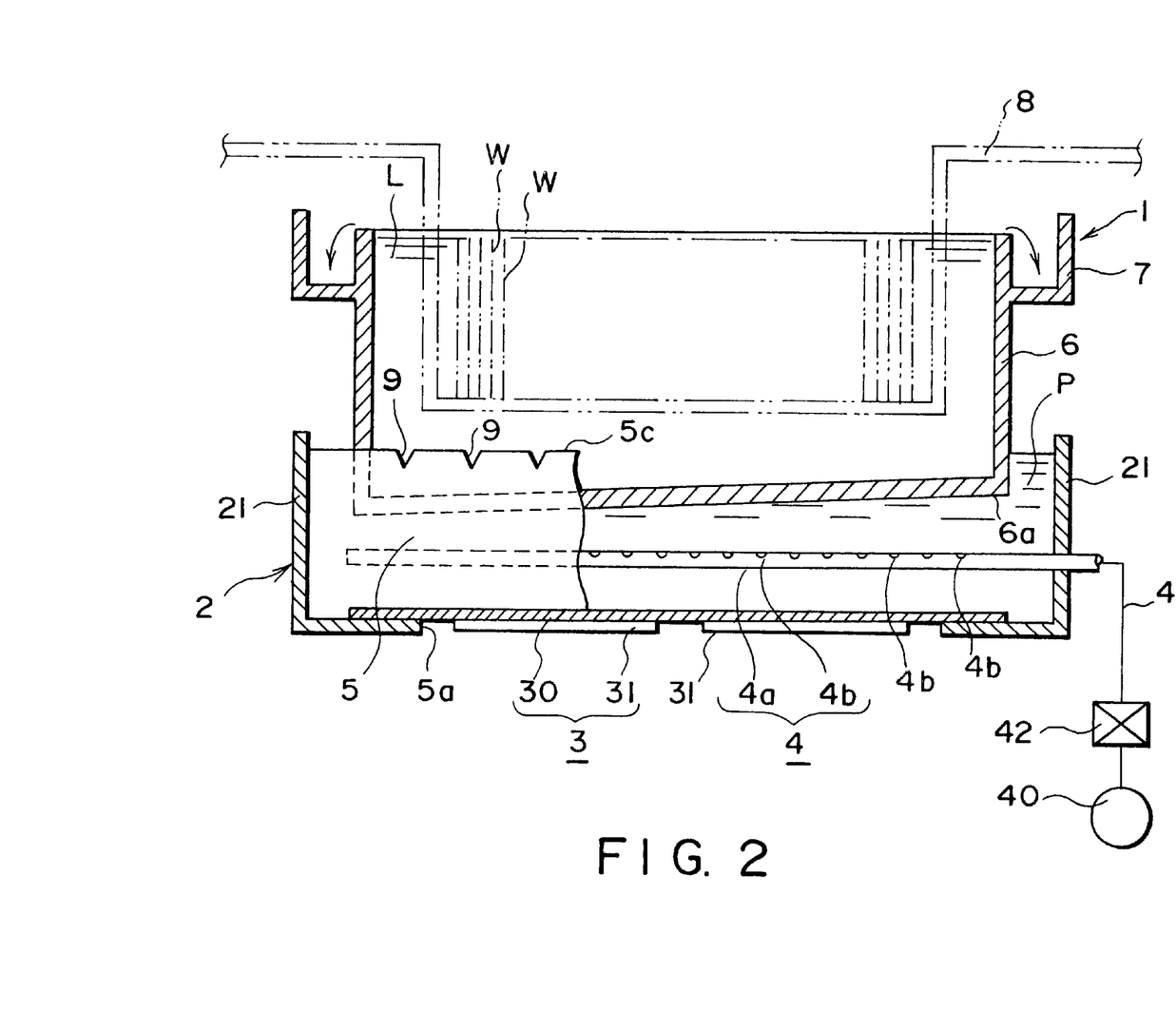
FIG. 2 is a schematic sectional view of the ultrasonic cleaning apparatus shown in FIG. 1.

Referring to FIGS. 1 and 2, an ultrasonic cleaning apparatus in a first embodiment according to the present invention comprises a cleaning tank 1, an intermediate tank 2, an ultrasonic unit (ultrasonic generator) 3 and a nozzle pipe 4.

The cleaning tank 1 is made of quartz and comprises an inner tank 6 and an outer tank 7. A chemical liquid L, i.e., a cleaning liquid, is stored in the inner tank 6. A plurality of workpieces (substrates), i.e., fifty semiconductor wafers W, are immersed in the chemical liquid L. The outer tank 7 is formed so as to surround an open upper end part of the inner tank 6 to contain the chemical liquid L overflowed the inner tank 6.

A wafer guide 8 is disposed in the inner tank 6 to hold the wafers W when immersing the same in the chemical liquid L. The outer surface 6a of the bottom wall of the inner tank 6 is inclined gently to a horizontal plane (FIG. 2). The inclination of the outer surface 6a of the bottom wall enhances the efficiency of removing bubbles adhering to the outer surface 6a of the bottom wall of the inner tank 6. A drain port 7a is formed in the bottom of the outer tank 7 and a drain pipe 7c is connected to the drain port 7a. A drain valve 7b is placed in the drain pipe 7c. A drain pipe, not shown, is connected to the bottom of the inner tank 6 to drain the chemical liquid L. A chemical liquid supply nozzle, not shown, for supplying the chemical liquid L into the inner tank 6 is placed in the inner tank 6.

The intermediate tank 2 is made of a polypropylene resin. The intermediate tank 2 has the shape of a rectangular solid having an open upper end, and has four side walls 21 and one bottom wall 5b.

The internal space of the intermediate tank 2 is divided into two regions, i.e., a liquid storing region 2a and a liquid recovering region 2b, by a partition plate 5 serving as a partition wall. Pure water P, i.e., a vibration propagating liquid, in which a lower part of the cleaning tank 1 is immersed is contained in the liquid storing region 2a, and the pure water P overflowed the liquid storing region 2a is contained in the liquid recovering region 2b.

Figure 3:
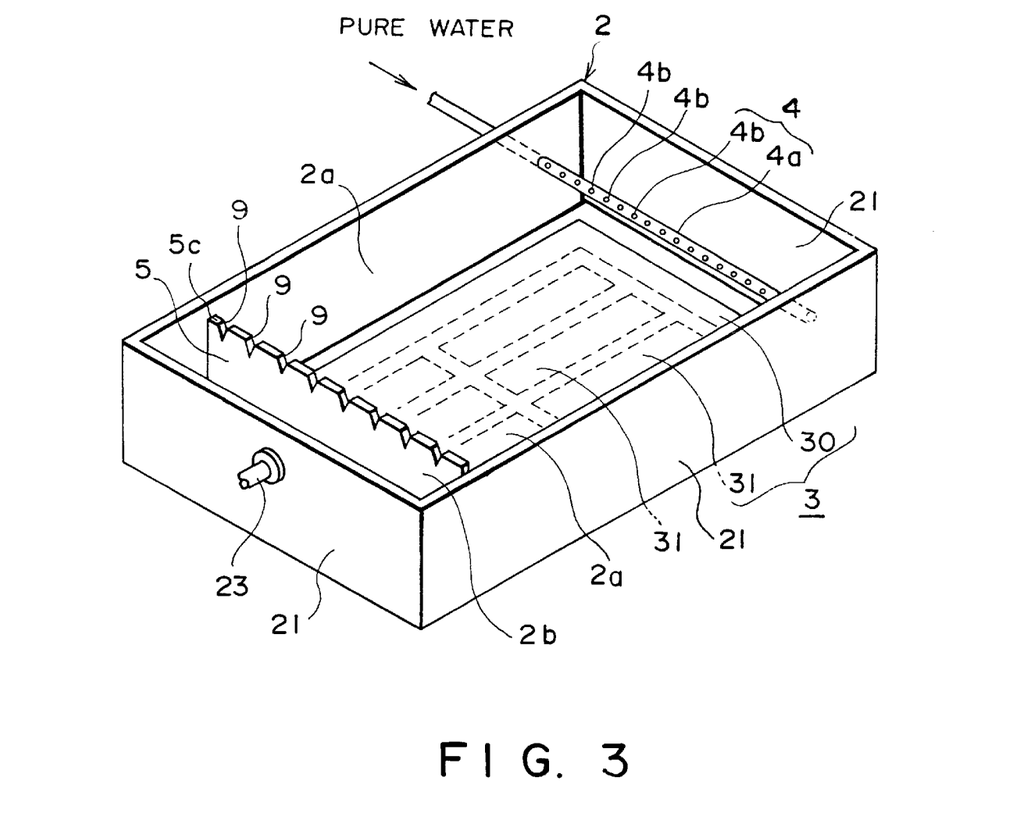
FIG. 3 is a perspective view of an intermediate tank included in the ultrasonic cleaning apparatus shown in FIG. 1.

A nozzle pipe 4 is disposed at a position remote from the partition plate 5 in the liquid storing region 2a. As shown in FIGS. 2 and 3, the nozzle pipe 4 is formed by forming a plurality of nozzle holes 4b at equal intervals in an obliquely upper part of a pipe 4a. As shown in FIG. 2, the nozzle holes 4b, i.e., nozzles are arranged in a range corresponding to the width of the outer surface 6a of the bottom wall of the inner tank 6 of the cleaning tank 1. The nozzle pipe 4 is connected by a pure water supply pipe 41 penetrating the side wall 21 of the intermediate tank 2 to a pure water source 40. An on-off valve 42 is placed in the pure water supply pipe 41 at a position near the pure water source 40. A plurality of nozzles may be arranged laterally as viewed in FIG. 2 instead of the nozzle pipe 4.

As best shown in FIG. 1, the level H5, with respect to a reference horizontal plane, of the upper edge 5c of the partition plate 5 is lower than the level H21, with respect to the reference horizontal plane, of the upper edge of the side wall 21 of the intermediate tank 2 and is higher than the level H6a of the outer surface 6a of the bottom wall of the inner tank 6 of the cleaning tank 1. As best shown in FIG. 3, a plurality of substantially V-shaped notches 9 are formed in the upper edge 5c of the partition plate S. The level H9 of the bottom of each notch 9 is lower than the level H21 of the upper edge of the side wall 21 of the intermediate tank 21 and is higher than the level H6a of the outer surface 6a of the bottom wall of the inner tank 6 of the cleaning tank 1.

A drain pipe 23 provided with a drain valve 22 is connected to the side wall 21 on the side of the liquid recovering region 2b. Pure water P accumulated in the liquid recovering region 2b can be drained through the drain pipe 23 from the liquid recovering region 2b.

As best shown in FIG. 1, The bottom wall 5b of the intermediate tank 5 is provided with a substantially rectangular opening 5a, and the ultrasonic unit 3 is disposed in the opening 5a. The ultrasonic unit 3 comprises a vibrating plate 30, and a plurality of transducers 31 attached to the lower surface of the vibrating plate 30. The vibrating plate 30 is bonded in a liquid-tight fashion with an adhesive or the like to the upper surface of a peripheral part of the bottom wall 5b around the opening 5a. The vibrating plate 30 is a metal plate, such as a stainless steel plate.

Figure 4:
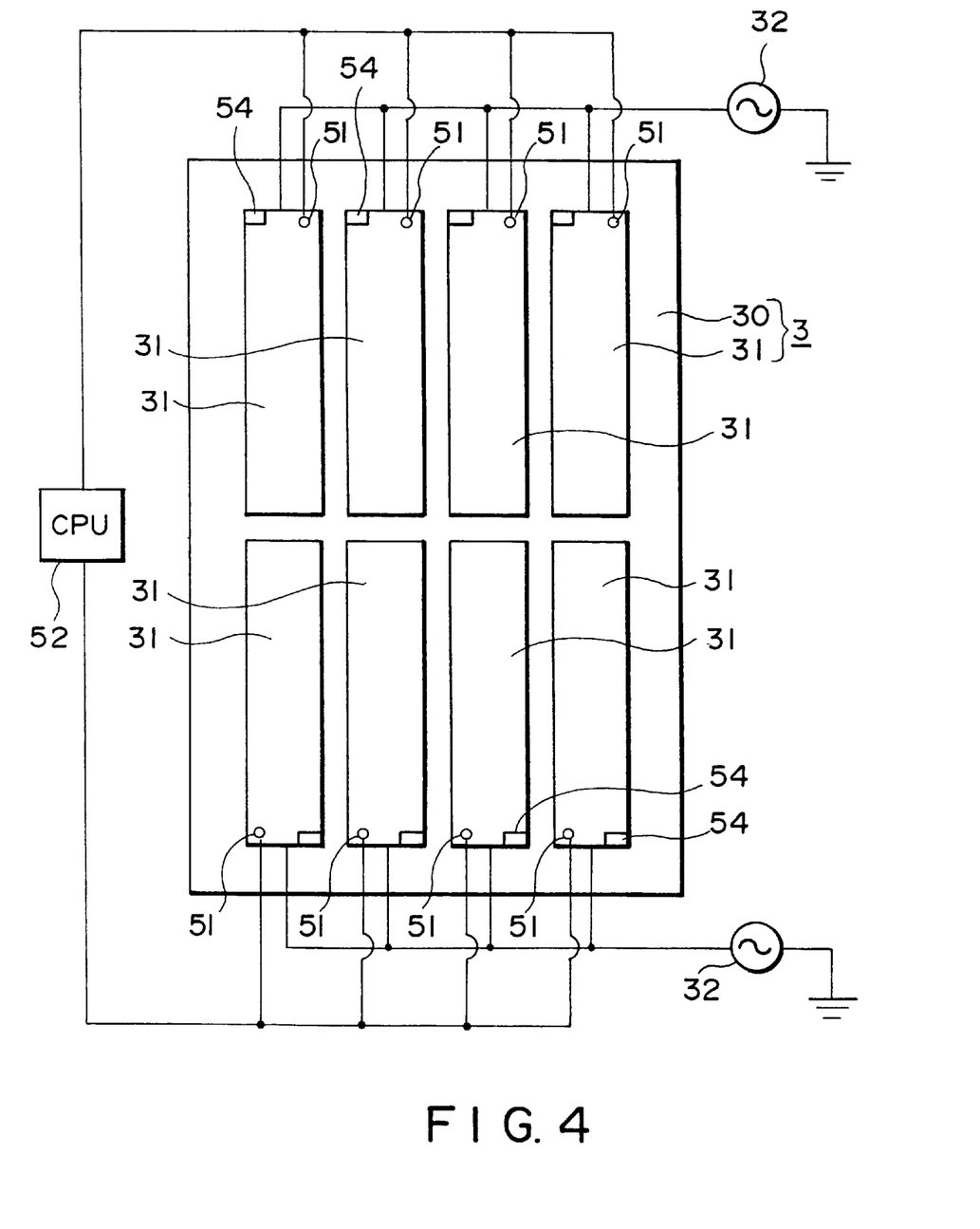
FIG. 4 is a plan view illustrating the arrangement of transducers of an ultrasonic generator, and the configuration of an electric system.

As best shown in FIG. 4, each transducer 31 is a rectangular ceramic plate and is bonded to the vibrating plate 30 with an adhesive or the like. In FIG. 4, the eight transducers 31 are arranged in two rows. The transducers 31 are electrically connected to ultrasonic oscillators 32 each comprising a high-frequency wave generator and a power supply unit. The ultrasonic oscillators 32 apply a high-frequency voltage to the transducers 31 for excitation to vibrate the vibrating plate 30 at a frequency in an ultrasonic range. A drain pipe, not shown, is connected to a part of the bottom wall of the intermediate tank 2 not corresponding to the ultrasonic unit 3.

Figure 5:
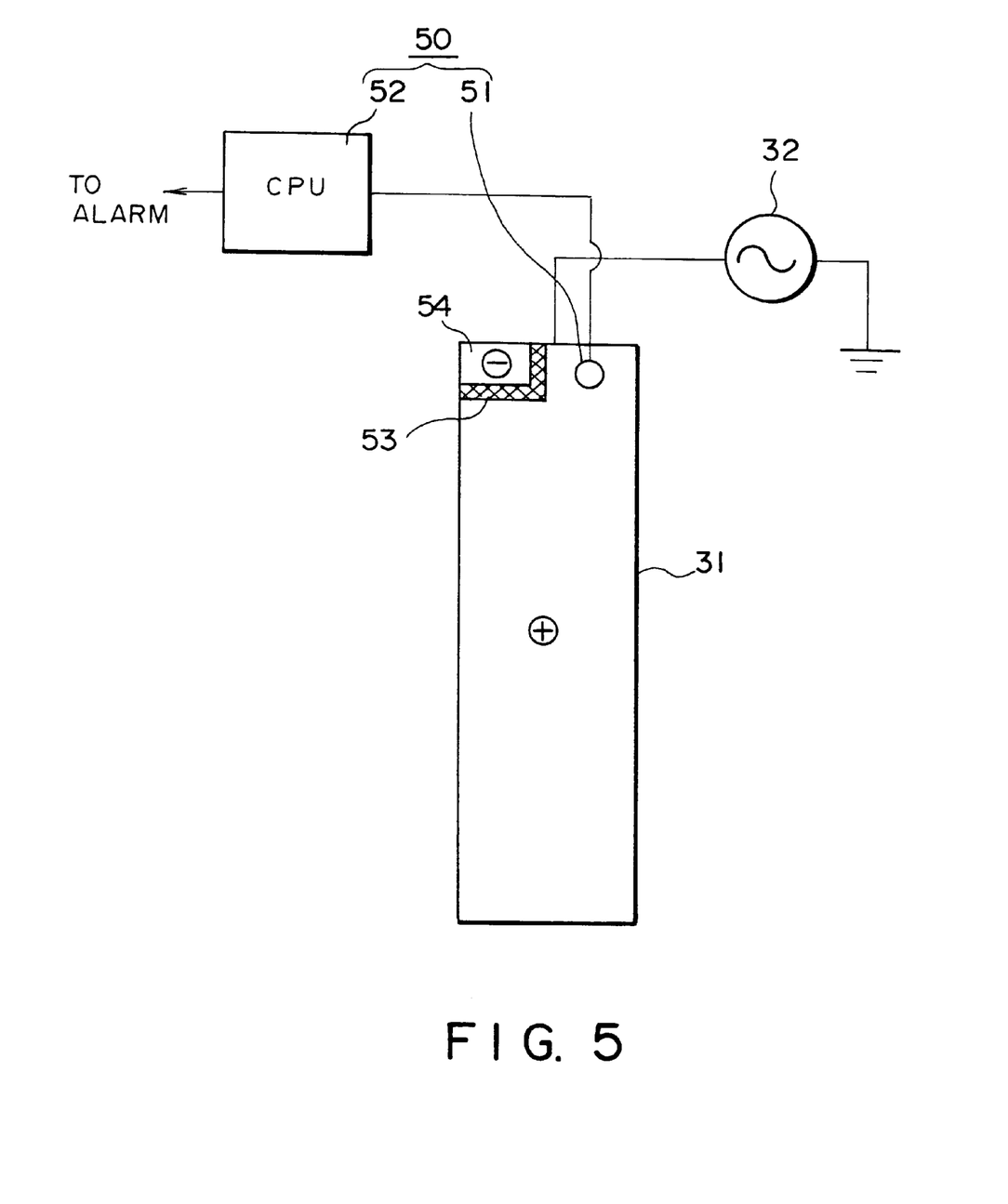
FIG. 5 is a plan view of the transducer shown in FIG. 4.

A detecting device 50 is combined with the ultrasonic unit 3 to detect abnormal ultrasonic vibrations. As shown in FIGS. 4 and 5, the detecting device 50 comprises output sensors 51 each bonded with an adhesive or the like to an end part of the front side of positive polarity of the transducer 31, and a central processing unit (CPU) 52, i.e., a controller. The CPU 52 receives the output signal of each output sensor 51, compares the output signal with data previously stored therein, and provides an alarm when necessary. The output sensor 51, similarly to the transducer 31, is a ceramic chip and is capable of converting the vibrations of the corresponding transducer 31 into a corresponding electric signal. An electrode 54 of the same polarity (negative polarity) as the back side of the transducer 31 is exposed in the front side of the transducer 31 at a position near the output sensor 51 attached to the front side of the transducer 31, and the electrode 54 is isolated from the front side by an insulating part 53. The output sensors 51 and the electrodes 54 are disposed at positions in a region outside a region corresponding to the bottom wall of the inner tank 6 of the cleaning tank 1.

Each output sensor 51 attached to the back side of each transducer 31 detects changes in the vibrating mode of the transducer 31 due to abnormal conditions created by the deterioration of the transducer 31, the separation of the transducer 31 from the vibrating plate 30 or the breakage of cables, and the CPU 52 provides an alarm when the operation of the transducer 31 is abnormal. In a conventional ultrasonic cleaning apparatus, a quarts probe is immersed in a chemical liquid contained in a processing tank 1 or a liquid contained in an intermediate tank 2 to detect abnormal conditions through the measurement of sound pressure. Therefore, abnormal conditions cannot be detected while the ultrasonic cleaning apparatus is in operation. In the ultrasonic cleaning apparatus in the first embodiment, the abnormal condition of the ultrasonic unit 3 can surely be detected. If the abnormal condition of the ultrasonic unit 3 is detected, the cleaning operation of the ultrasonic cleaning apparatus is interrupted immediately, and the ultrasonic unit 3 is replaced with a normal one.

The operation of the ultrasonic cleaning apparatus will be described below.

Pure water P is supplied from the pure water source 40 into the liquid storing region 2a of the intermediate tank 2 to store an amount of pure water P that enables a bottom part of the inner tank 6 can be immersed in the pure water P contained in the liquid storing region 2a. The chemical liquid L is supplied through a chemical liquid supply pipe, not shown, into the inner tank 6 so that the inner tank 6 is almost full to its brim. The chemical liquid L is a diluted hydrofluoric acid solution (DHF solution) for removing oxide films formed on wafers W, a mixed solution of ammonia and hydrogen peroxide (APM solution) for removing foreign materials (organic contamination, adhering particles, or the like), a mixed solution of hydrochloric acid and hydrogen peroxide (HPM solution) for removing metallic impurities, or the like.

Wafers W a carried by a wafer carrying device, not shown, the wafers W are transferred from the wafer carrying device to the wafer guide 8, and then the wafers W are immersed in the chemical liquid L contained in the inner tank 6. Then, the ultrasonic oscillators 32 are actuated to vibrate the vibrating plate 30. The vibrations of the vibrating plate 30 are propagated by the pure water P contained in the intermediate tank 2 and are transmitted to the chemical liquid L contained in the inner tank 6. Particles and such adhering to the wafers W are removed by the ultrasonic vibrations generated by the vibrating plate 30.

Meanwhile, the chemical liquid L is supplied continuously at an appropriate rate into the inner tank 6 through a chemical liquid supply pipe, not shown, so that particles and such removed from the wafers W and floating in the surface of the chemical liquid L can effectively be made to flow outside the inner tank 6 into the outer tank 7 together with the overflowing chemical liquid L. Thus, the chemical liquid L contained in the inner tank 6 can be maintained clean. The drain valve 7b is opened to discharge the waste chemical liquid L overflowed the inner tank 6 into the outer tank 7 through the drain pipe 7c.

While the wafers W are being cleaned, pure water P is jetted continuously toward the outer surface 6a of the bottom wall of the inner tank 6. The pure water P jetted toward the outer surface 6a of the bottom wall of the inner tank 6 removes bubbles adhering to the outer surface 6a of the bottom wall of the inner tank 6 and flows toward the partition plate 5. Since the partition plate 5 is disposed on the side of the liquid recovering region 2b of the intermediate tank 2, and the level H5 of the upper edge of the partition plate 5 is lower than the level H21 of the upper edge of the side wall 21 of the intermediate tank 2, the pure water P in the liquid storing region 2a overflows over the partition plate 5 into the liquid recovering region 2b. Since the nozzle pipe 4 and the partition plate 5 are disposed in the foregoing positional relation, the pure water P jetted by the nozzle pipe 4 flows smoothly in the direction of the arrows F (see FIG. 1) toward the partition plate 5, and overflows via the partition plate 5. Thus, bubbles can be removed from the outer surface 6a of the bottom wall of the inner tank 6 at an increased bubble removing efficiency.

Since the notches 9 are arranged at equal intervals in the upper edge of the partition plate 5, the pure water P flows through the notches 9 evenly into the liquid recovering region 2b. Currents of the pure water P jetted through the nozzle holes 4b of the nozzle pipe 4 flows in substantially the same direction in the direction along the longitudinal dimension of the liquid storing region 2a, i.e., in a lateral direction as viewed in FIG. 1, toward the partition plate 5. Therefore, the velocities of the currents of the pure water P in the vicinity of the outer surface 6a of the bottom wall of the inner tank 6 are substantially the same. Accordingly, bubbles adhering to the outer surface 6a of the bottom wall of the inner tank 6 can evenly be removed. Thus, the notches 9 straighten the flow of the pure water P to contribute to the enhancement of bubble removing efficiency.

Bubbles adhering to the outer surface 6a of the bottom wall of the inner tank 6 can substantially completely removed without jetting pure water P through the nozzle pipe 4 at an excessively high flow rate. In this ultrasonic cleaning apparatus, a flow rate of 2 l/min at which pure water P is jetted through the nozzle pipe 4 is sufficiently high. Thus, the ultrasonic vibrations can be propagated at an increased propagation efficiency, which enables the ultrasonic cleaning apparatus clean wafers at an increased cleaning efficiency.

An ultrasonic cleaning apparatus in a second embodiment according to the present invention will be described with reference to FIGS. 6 and 7. The ultrasonic cleaning apparatus in the second embodiment includes an intermediate tank 2 having only a liquid storing region 2a. The intermediate tank 2 does not have any region corresponding to the liquid recovering region 2b of the intermediate tank 2 of the first embodiment and is not provided with any member corresponding to the partition plate 5.

The ultrasonic cleaning apparatus in the second embodiment is similar in construction to the ultrasonic cleaning apparatus in the first embodiment and hence parts of the ultrasonic cleaning apparatus in the second embodiment like or corresponding to those of the ultrasonic cleaning apparatus in the first embodiment are designated by the same reference characters and the description thereof will be omitted.

Figure 6:
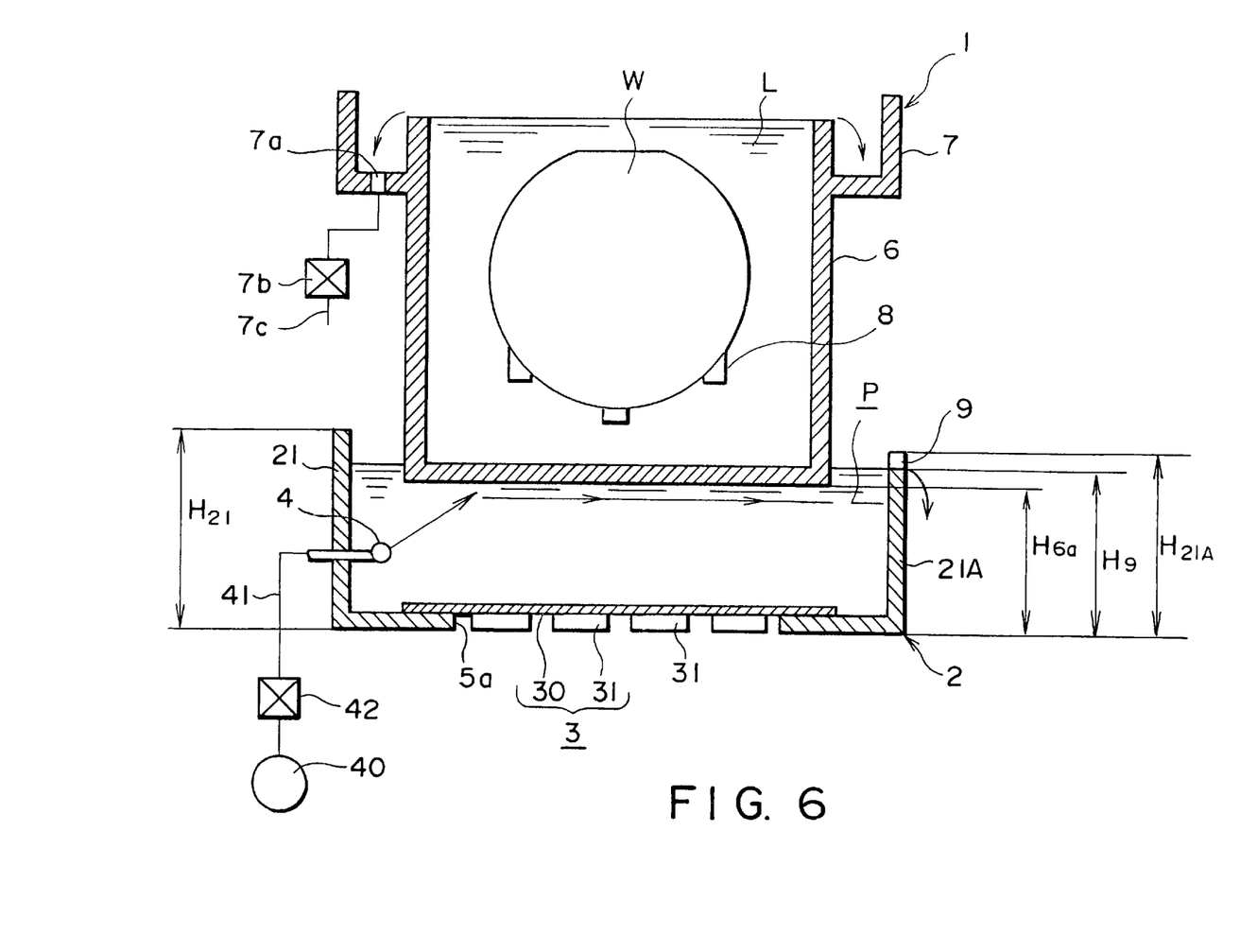
FIG. 6 is a schematic sectional view of an ultrasonic cleaning apparatus in a second embodiment according to the present invention.
Figure 7:
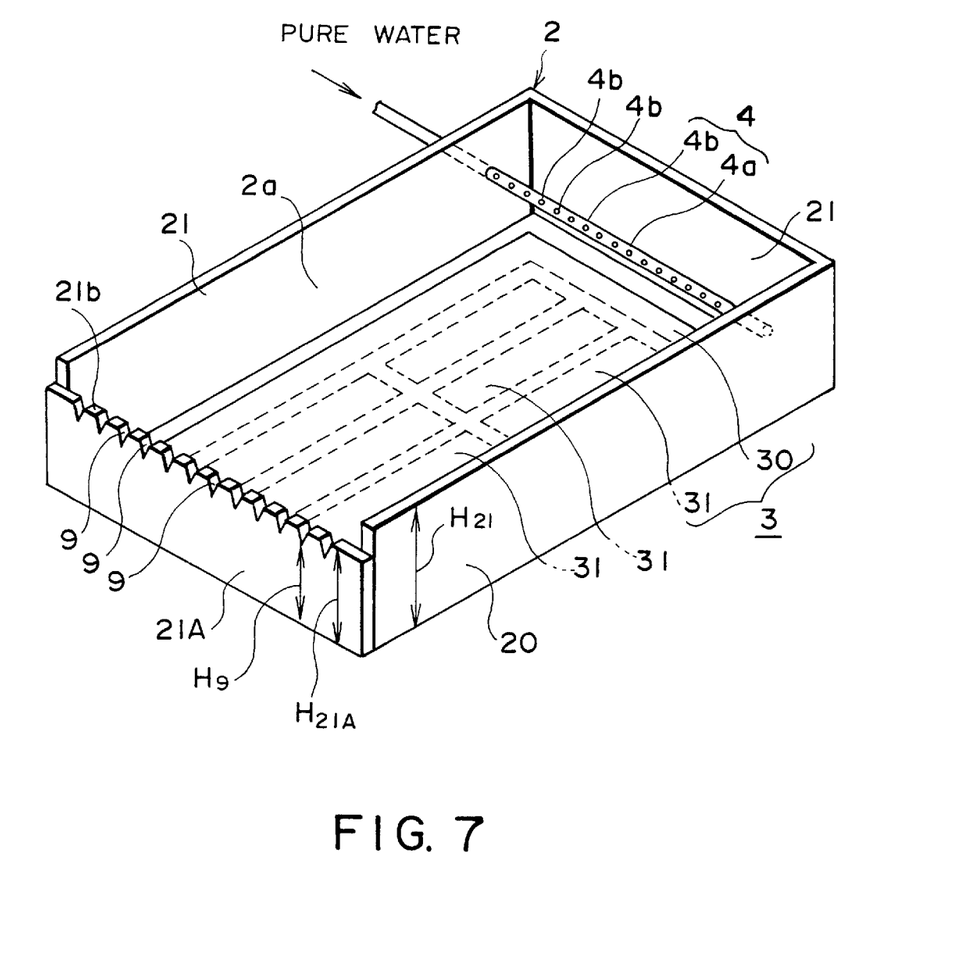
FIG. 7 is a perspective view of an intermediate tank included in the ultrasonic cleaning apparatus shown in FIG. 6.

Referring to FIGS. 6 and 7, in the ultrasonic cleaning apparatus in the second embodiment, the level H21A of a side wall 21A on a side of the intermediate tank 2 opposite a side in which a nozzle pipe 4 is disposed is lower than those H21 of the upper edges of the other three side walls 21. A plurality of V-shaped notches 9 are formed at predetermined intervals in the upper edge 21b of the side wall 21A. The level H9 of the bottom of each notch 9 is lower than the level H21 of the upper edges of the three side walls 21 of the intermediate tank 2 and is higher than the level H6a of the outer surface 6a of the bottom wall of an inner tank 6 included in a cleaning tank 1 as immersed in pure water P contained in the intermediate tank 2 (FIGS. 6 and 7).

Pure water P jetted toward the outer surface 6a of the bottom wall of the inner tank 6 flows toward the side wall 21A, overflows the intermediate tank 2 evenly through the notches 9 formed in the side wall 21A and removes bubbles adhering to the outer surface 6a of the bottom wall of the inner tank 6. Thus, the second embodiment is the same in effect as the first embodiment.

The notches 9 formed in the respective upper edges of the partition plate 5 and the side wall 21A of the intermediate tank 2 need not necessarily be of a V-shape; the same may be of any suitable shape, such as a U-shape.

Figure 8:
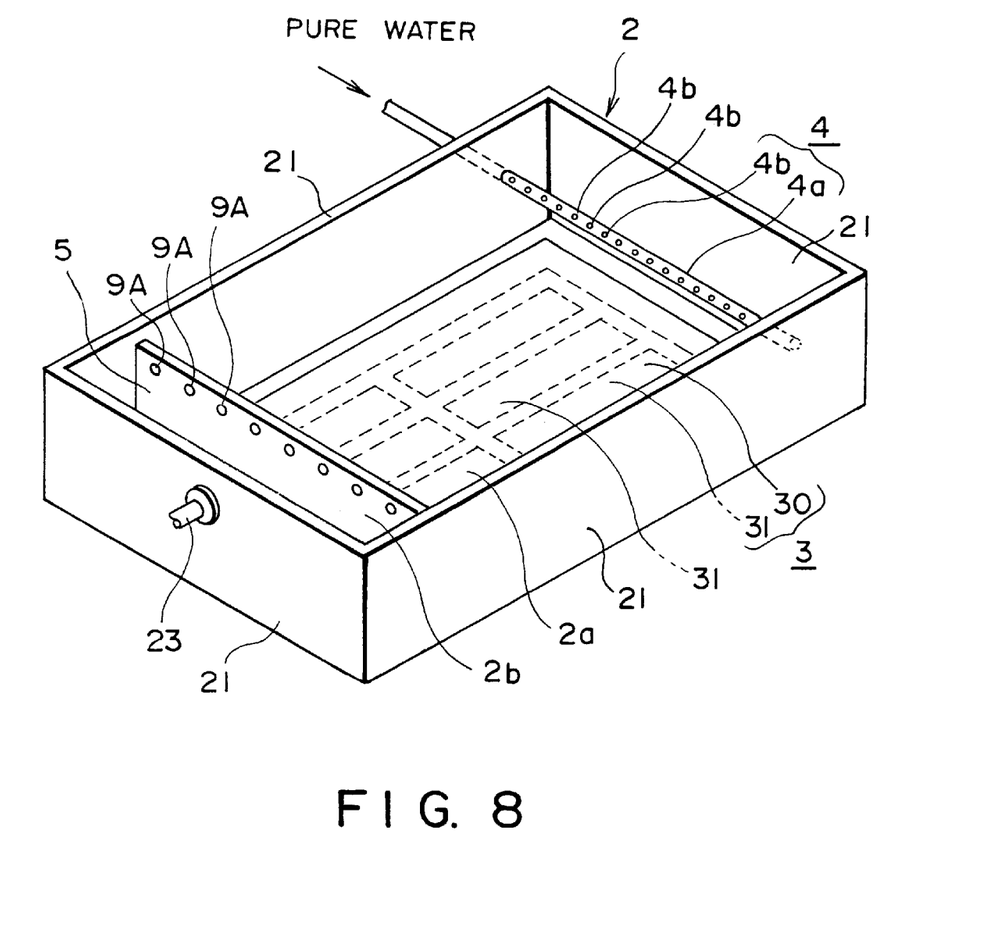
FIG. 8 is a modification of the intermediate tank of the ultrasonic cleaning apparatus shown in FIG. 1.
Figure 9:
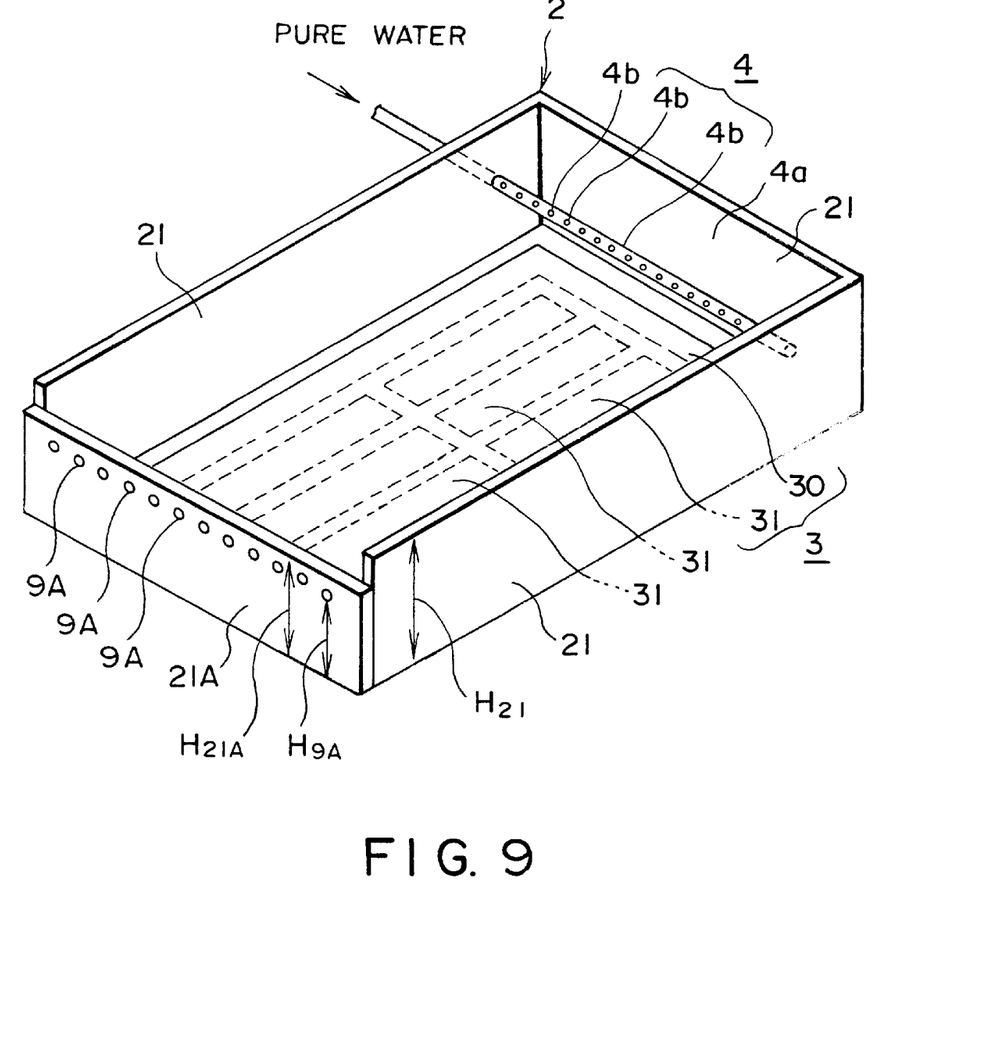
FIG. 9 is a modification of the intermediate tank of the ultrasonic cleaning apparatus shown in FIG. 6.

In a modification of the first embodiment, a partition plate 5 may be provided with a plurality of through holes 9A arranged at appropriate intervals in an upper part thereof as shown in FIG. 8 instead of the notches 9 formed in the upper edge 5c thereof. In a modification of the second embodiment, a side wall 21A may be provided with a plurality of through holes 9A in an upper part thereof as shown in FIG. 9 instead of the notches 9 formed in the upper edge 21b thereof. In those modifications, the level H9A with respect to a reference horizontal plane of the through holes 9A is lower than the level H21 of the side walls 21 of an intermediate tank 2 and is higher than the level H6a of the outer surface 6a of the bottom wall of an inner tank 6 included in a cleaning tank 1 and immersed in pure water contained in the intermediate tank 2.

Although it is desirable that the partition plate 5 and the side wall 21A of the intermediate tank 2 are provided with the notches 9 or the through holes 9A, the partition plate 5 and the side wall 21A need not necessarily be provided with the notches 9 or the through holes 9A, because pure water P flows smoothly from the nozzle pipe 4 toward the partition plate 5 and the side wall 21A of the intermediate tank 2 provided that the level of the upper edge 5c of the partition plate 5 and that of the upper edge 21b of the side wall 21A are lower than the level of the upper edges of the other three side walls 21 of the corresponding intermediate tanks 2, respectively.

In the second embodiment, the intermediate tank may be provided with an outer tank for receiving the pure water P flowing out from the intermediate tank. In this case, the intermediate tank and the outer tank may be formed integrally, as shown in FIG. 3.

An ultrasonic cleaning apparatus in a third embodiment according to the present invention will be described hereinafter with reference to FIGS. 10 and 11, in which parts like or corresponding to those of the first and the second embodiment are designated by the same reference characters and the description thereof will be omitted. The third embodiment will be described particularly in a cleaning liquid temperature regulating system employed therein.

Figure 10:
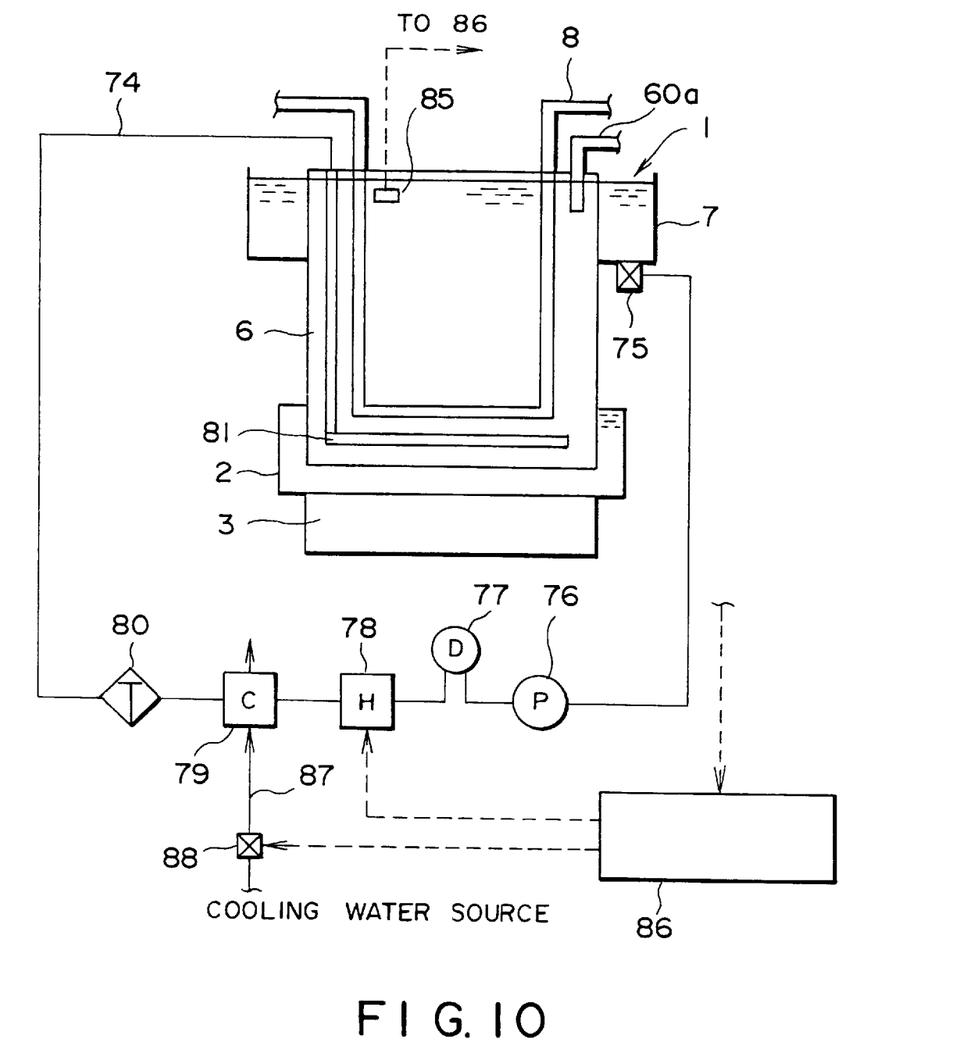
FIG. 10 is a schematic sectional view of an ultrasonic cleaning apparatus in a third embodiment according to the present invention.
Figure 11:
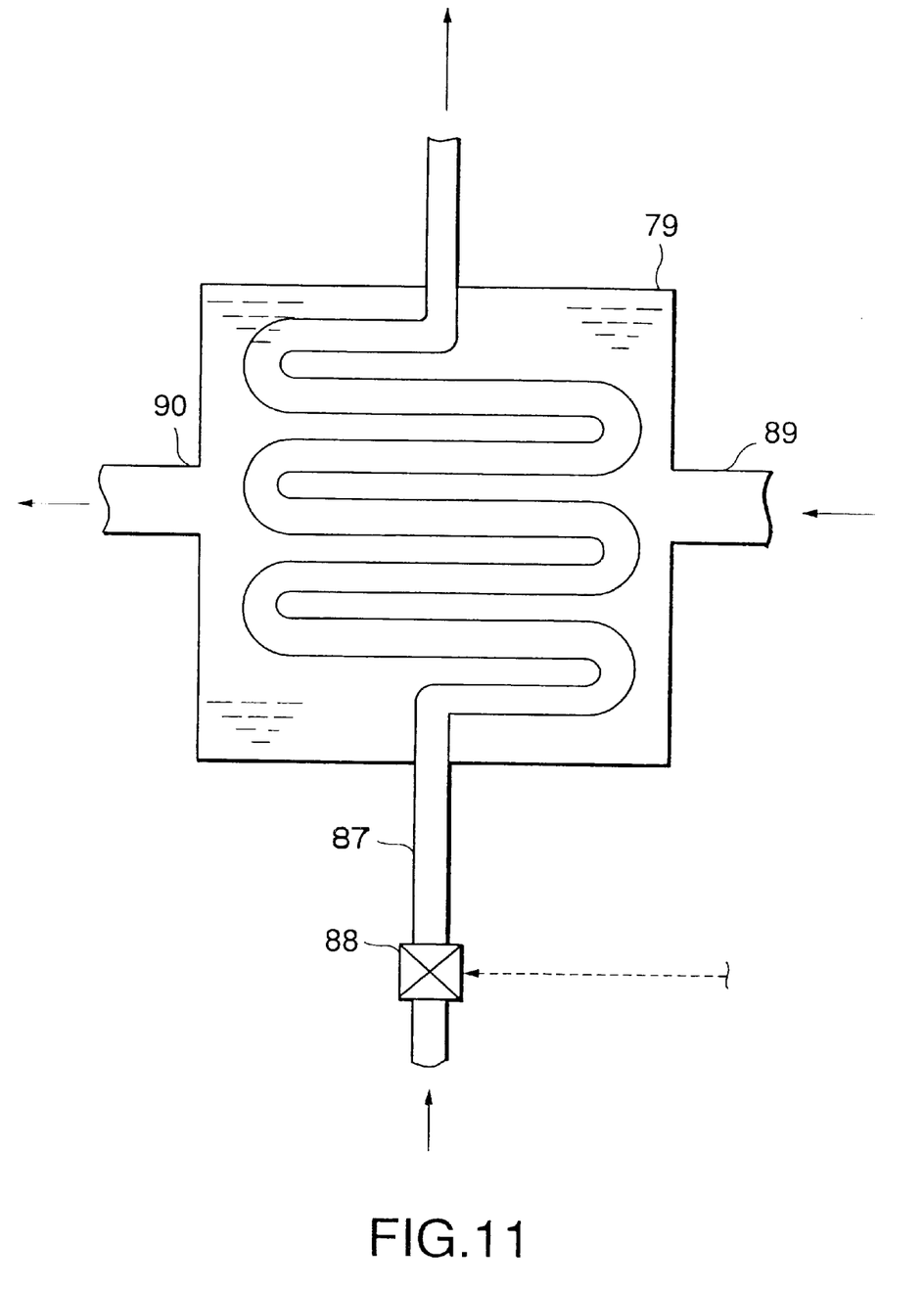
FIG. 11 is a sectional view of a heat exchanger shown in FIG. 10.

Referring to FIG. 10, a cleaning liquid circulating circuit 74 is connected to the inner tank 6 and the outer tank 7 to circulate a cleaning liquid through the inner tank 6 and the outer tank 7 while the ultrasonic cleaning apparatus is in a cleaning operation for cleaning wafers W. One end of the cleaning liquid circulating circuit 74 is connected to a valve 75 connected to the bottom wall of the outer tank 7, and the other end of the same is connected to nozzles 81 (only one of the nozzles 81 is shown in FIG. 10). A pump 76, a damper 77, a heater 78, a heat exchanger 79 and a filter 80 are placed and arranged in that order in the cleaning liquid circulating circuit 74. The nozzles 81 are disposed in a lower part of the cleaning tank 1 to jet a cleaning liquid upward toward the wafers W.

A temperature sensor 85 is placed in the inner tank 6 to measure the temperature of the cleaning liquid contained in the inner tank 6 and is connected to a controller 86. The heater 78 is connected to the controller 86. A valve 88 is placed in a cooling water supply line 87 for supplying cooling water into the heat exchanger 79 and is connected to the controller 86.

The heat exchanger 79 cools the cleaning liquid before the same is supplied into the inner tank 6 in order that the cleaning liquid may not be heated to temperatures higher than a predetermined processing temperature by ultrasonic waves generated by the ultrasonic unit 3. As shown in FIG. 11, the heat exchanger 79 has an inlet port 89 connected to the heater 78, and an outlet port 90 connected to the filter 80. A cooling water supply passage 87 is extended through the heat exchanger 79 to cool the cleaning liquid flowing through the heat exchanger 79 by cooling water flowing through the cooling water supply passage 87. Pipes forming the cooling water supply passage 87 is made of PFA (perfluoroalcoxyalkene resin, i.e., a tetrafluoroethyleneperphloroalkylvinyl ether copolymer). When cooling the cleaning liquid before supplying the same into the inner tank 6, the controller 86 provides a control signal to open the valve 88, and then cooling water is supplied through the cooling water supply passage 87 into the heat exchanger 79 to cool the cleaning liquid flowing through the heat exchanger 79.

The heater heats the cleaning liquid before the same is supplied into the inner tank 6 in order that the temperature of the cleaning liquid contained in the inner tank 6 may not drop below the predetermined processing temperature. When heating the cleaning liquid before supplying the same into the inner tank 6, the controller 86 provides a control signal to heat the cooling liquid by the heater 78.

The operation of the ultrasonic cleaning apparatus provided with the cleaning liquid temperature regulating system will be described below.

The cleaning liquid regulated at an ordinary temperature of, for example, 30° C. is supplied into the inner tank 6 by a cleaning liquid supply circuit 60a to fill up the inner tank 6. Then, a wafer carrier, not shown, holding wafers W is lowered into the inner tank 6 to transfer the wafers W to the wafer guide 8 and to immerse the wafers W in the cleaning liquid contained in the inner tank 6. Subsequently, the ultrasonic unit 3 is actuated to carry out a cleaning process.

The cleaning liquid circulating circuit 74 starts circulating the cleaning liquid. The valve 75 is opened to allow the cleaning liquid overflowed the inner tank 6 into the outer tank 7 to flow into the cleaning liquid circulating circuit 74. The pump 76 generates the flow of the cleaning liquid through the damper 77, the heater 78, the heat exchanger 79 and the filter 80 in that order, the temperature of the cleaning liquid is regulated and the cleaning liquid is cleaned while the same flows through the cleaning liquid circulating circuit 74. Then, the thus cleaned cleaning liquid is returned through the nozzles 81 into the inner tank 6. The cleaning liquid is thus circulated to use the same repeatedly to thereby save the cleaning liquid.

It is important for the effective cleaning process to maintain the cleaning liquid at the predetermined temperature, i.e., a low ordinary temperature, in the inner tank 6. Water molecules of the cleaning liquid contained in the inner tank 6 are driven for ultrasonic vibrations by ultrasonic waves generated by the ultrasonic unit 3 and absorb the energy of the ultrasonic waves, so that the temperature of the cleaning liquid rises slightly. If the temperature of the cleaning liquid is left rising to an excessively high temperature, the cleaning ability of the cleaning liquid will be enhanced excessively, and combined actions of the ultrasonic vibrations and the excessively high temperature of the cleaning liquid will do damage to the surfaces of the wafers W.

Therefore, the cleaning liquid is cooled beforehand by the heat exchanger 79 and the thus cooled cleaning liquid is supplied through the cleaning liquid circulating circuit 74 in anticipation of a rise in its temperature in the inner tank 6 attributable to the effect of the energy of ultrasonic vibrations generated by ultrasonic waves generated by the ultrasonic unit 3. The cleaning liquid absorbs the energy of ultrasonic waves, the cleaning liquid is heated at the predetermined processing temperature by the energy absorbed from ultrasonic waves and cleans the wafers W effectively. The cleaning liquid thus cooled by the heat exchanger 79 is supplied continuously into the inner tank 6, the cleaning liquid supplied into the inner tank overflows the inner tank 6 into the outer tank 7 before the same is heated further by the energy of ultrasonic waves to an excessively high temperature beyond an allowable temperature limit. Therefore, the cleaning liquid contained in the inner tank 6 can be kept at the predetermined processing temperature.

Upon the start of circulation of the cleaning liquid, the temperature sensor 85 starts measuring the temperature of the cleaning liquid contained in the inner tank 6, and gives a temperature signal indicating a measured temperature to the controller 86. When the controller 86 decides, on the basis of the temperature signal given thereto, that the cleaning liquid will be heated to temperatures higher than the predetermined processing temperature, the controller 86 provides a control signal to open the valve 88. Then, cooling water flows through the cooling water supply passage 87 into the heat exchanger 79 to cool the cleaning liquid quickly.

Thus, the cleaning liquid contained in the inner tank 6 of the cleaning tank 1 is kept at the predetermined processing temperature by supplying the previously cooled cleaning liquid into the inner tank 6. Thus, the cleaning liquid is kept constantly at the predetermined processing temperature in the inner tank 6, which has been difficult to achieve by the conventional ultrasonic cleaning apparatus. Consequently, any damage is not done to the surfaces of the wafers W by the cleaning process and the wafers can satisfactorily be cleaned.

When the controller 86 decides, on the basis of the temperature signal given thereto by the temperature sensor 85, that the temperature of the cleaning liquid contained in the inner tank 6 will drop below the predetermined processing temperature, the controller 86 outputs a control signal to the heater 78 on the basis of the temperature measured by the temperature sensor 85, so as to quickly raise the temperature of the cleaning liquid contained in the inner tank 6. Then, the controller 86 provides a control signal based on the calculated quantity of heat to heat the cleaning liquid by the heater 78. The cleaning liquid thus heated is supplied into the inner tank 6 to maintain the cleaning liquid contained in the inner tank 6 at the predetermined processing temperature. Thus, the cleaning liquid of a regulated temperature, i.e., the cooled cleaning liquid cooled by the heat exchanger 79 or the heated cleaning liquid heated by the heater 78, is supplied into the inner tank 6 of the cleaning tank 1 depending on the temperature of the cleaning liquid contained in the inner tank 6, so that the cleaning liquid contained in the inner tank 6 is kept at the predetermined processing temperature while the ultrasonic cleaning apparatus is in operation.

After the completion of one cleaning cycle for cleaning one batch of wafers W, another batch of wafers W is carried into the cleaning tank 1 and the cleaning cycle is repeated for the new batch of wafers W. The cleaning liquid contained in the inner tank 6 is kept at the predetermined processing temperature for every cleaning cycle, so that the satisfactory cleaning cycle can be repeated for a plurality of batches of wafers.

The cleaning liquid contained in the inner tank 6 can be kept at a desired temperature by supplying the cleaning liquid previously cooled by the heat exchanger 79. Therefore, it is possible to avoid doing damage to the surfaces of the wafers W by the cleaning liquid heated at temperatures exceeding an allowable limit temperature and excited by ultrasonic waves. Thus, the cleaning liquid kept constantly at the predetermined processing temperature in the inner tank 6 enables the achievement of a desirable cleaning process, which has been difficult to achieve by the conventional ultrasonic cleaning apparatus. If the temperature of the cleaning liquid contained in the inner tank 6 tends to drop, the cleaning liquid to be supplied into the inner tank 6 is heated by the heater 78 of the cleaning liquid circulating circuit 74. Thus, the cleaning liquid contained in the inner tank 6 can be kept constantly at the predetermined processing temperature regardless of effects causing the variation of the temperature of the cleaning liquid in the inner tank 6. Consequently, the deterioration of the ultrasonic cleaning apparatus and the resultant increase in cleaning time can be avoided, a satisfactory wafer cleaning process can be repeated many times.

In the cleaning liquid circulating circuit 74, the heater 78 may be placed below the heat exchanger 79 with respect to the flowing direction of the cleaning liquid. The cleaning liquid can be heated after the same has been cooled when the heater 78 and the heat exchanger 79 are arranged in such an order, which enables the use of the easily controllable heater 78 for the final adjustment of the temperature of the cleaning liquid.

The cleaning liquid temperature regulating system can be used for keeping the cleaning liquid contained in the inner tank 6 at a high temperature instead of constantly keeping the cleaning liquid in the inner tank 6 at the low temperature as mentioned above.

Although the invention has been described as applied to the ultrasonic cleaning apparatuses in the first to the third embodiment for cleaning semiconductor wafers, the present invention is not limited thereto in its practical application and is applicable to cleaning apparatuses for cleaning substrates other than semiconductor wafers, such as LCD substrates, glass substrates, CD substrates, photomasks, printed wiring boards, ceramic substrates and the like.

What is claimed is:

1. A cleaning apparatus comprising:
   a cleaning tank for containing a cleaning liquid for cleaning an object, said cleaning tank including a bottom wall having an outer surface;
   an intermediate tank for storing a vibration propagating liquid in which a lower part of the cleaning tank is immersed, said intermediate tank having a first side and a second side opposed to each other, said intermediate tank being provided with a discharging part at the first side thereof so as to cause the vibration propagating liquid to flow out of the intermediate tank;

an ultrasonic generating means provided at the intermediate tank to exert ultrasonic vibrations on the vibration propagating liquid; and a vibration propagating liquid supplying means disposed in the second side of the intermediate tank so as to supply the vibration propagating liquid toward the first side of the intermediate tank, wherein the intermediate tank has side walls, one of the side walls being located at the first side of the intermediate tank and having an upper edge, said upper edge having a level lower than those of the other of the side walls and higher than that of the outer surface of the bottom wall of the cleaning tank, whereby an upper edge of the one of the side walls serves as the discharging part of the intermediate tank.

2. The cleaning apparatus according to claim 1, wherein the vibration propagating liquid supplying means supplies the vibration propagating liquid toward the outer surface of the bottom wall of the cleaning tank.

3. A cleaning apparatus comprising:

a cleaning tank for containing a cleaning liquid for cleaning an object, said cleaning tank including a bottom wall having an outer surface;

an intermediate tank for storing a vibration propagating liquid in which a lower part of the cleaning tank is immersed, said intermediate tank having a first side and a second side opposed to each other, said intermediate tank being provided with a discharging part at the first side thereof so as to cause the vibration propagating liquid to flow out of the intermediate tank;

an ultrasonic generating means provided at the intermediate tank to exert ultrasonic vibrations on the vibration propagating liquid; and a vibration propagating liquid supplying means disposed in the second side of the intermediate tank so as to supply the vibration propagating liquid toward the first side of the intermediate tank, wherein the intermediate tank has side walls, one of the side walls being located at the first side of the intermediate tank and having an upper edge; and wherein the upper edge of the one of the side walls is provided with recesses, each of bottoms of the recesses having a level lower than those of the other of the side walls and higher than that of the outer surface of the bottom wall of the cleaning tank, whereby the recesses serves as the discharging part of the intermediate tank.

4. The cleaning apparatus according to claim 3, wherein the recesses are V-shaped notches.

5. A cleaning apparatus comprising:

a cleaning tank for containing a cleaning liquid for cleaning an object, said cleaning tank including a bottom wall having an outer surface;

an intermediate tank for storing a vibration propagating liquid in which a lower part of the cleaning tank is immersed, said intermediate tank having a first side and a second side opposed to each other, said intermediate tank being provided with a discharging part at the first side thereof so as to cause the vibration propagating liquid to flow out of the intermediate tank;

an ultrasonic generating means provided at the intermediate tank to exert ultrasonic vibrations on the vibration propagating liquid; and a vibration propagating liquid supplying means disposed in the second side of the intermediate tank so as to supply the vibration propagating liquid toward the first side of the intermediate tank, wherein the intermediate tank has side walls, one of the side walls being located at the first side of the intermediate tank and having an upper portion; and wherein the upper portion of the one of the side walls is provided with at least one through hole, each of the at least one through hole having a level lower than those of the other of the side walls and higher than that of the outer surface of the bottom wall of the cleaning tank, thereby the at least one through hole serves as the discharging part of the intermediate tank.

6. The cleaning apparatus according to claim 1, wherein the vibration propagating liquid supply means comprises a plurality of nozzles for jetting the vibration propagating liquid.

7. The cleaning apparatus according to claim 5, wherein the outer surface of the bottom wall of the cleaning tank is inclined to a horizontal plane with respect to a direction perpendicular to a flowing direction of the vibration propagating liquid supplied into the intermediate tank by the vibration propagating liquid supply means.

8. A cleaning apparatus comprising:

an intermediate tank having a plurality of side walls;

a partition wall for partitioning the intermediate tank into a first region for storing a vibration propagating liquid therein and a second region for receiving the vibration propagating liquid flowing out from the first region;

a cleaning tank having a bottom portion and capable of containing a cleaning liquid for cleaning an object;

a ultrasonic generating means provided at the first region of the intermediate tank so as to exert ultrasonic vibrations on the vibration propagating liquid; and a vibration propagating liquid supplying means disposed at a position opposite to the partition wall in the first region of the intermediate tank so as to supply the vibration propagating liquid toward the partition wall;

wherein the vibration propagating liquid flows out from the first region to the second region via the partition wall, wherein the partition wall has an upper edge having a level lower than those of the side walls of the intermediate tank and higher than that of the outer surface of the bottom wall of the cleaning tank; and wherein the vibration propagating liquid flows out from the first region to the second region over an upper edge of the partition wall.

9. A cleaning apparatus comprising:

an intermediate tank having a plurality of side walls;

a partition wall for partitioning the intermediate tank into a first region for storing a vibration propagating liquid therein and a second region for receiving the vibration propagating liquid flowing out from the first region;

a cleaning tank having a bottom portion and capable of containing a cleaning liquid for cleaning an object;

a ultrasonic generating means provided at the first region of the intermediate tank so as to exert ultrasonic vibrations on the vibration propagating liquid; and a vibration propagating liquid supplying means disposed at a position opposite to the partition wall in the first region of the intermediate tank so as to supply the vibration propagating liquid toward the partition wall;

wherein the vibration propagating liquid flows out from the first region to the second region via the partition wall, wherein the partition wall has an upper edge provided with recesses, each of recesses having a bottom with a level lower than those of the side walls of the intermediate tank and higher than that of the outer surface of the bottom wall of the cleaning tank; and wherein the vibration propagating liquid flows out from the first region to the second region via the recesses of the partition wall.

10. A cleaning apparatus comprising:

an intermediate tank having a plurality of side walls;

a partition wall for partitioning the intermediate tank into a first region for storing a vibration propagating liquid therein and a second region for receiving the vibration propagating liquid flowing out from the first region;

a cleaning tank having a bottom portion and capable of containing a cleaning liquid for cleaning an object;

a ultrasonic generating means provided at the first region of the intermediate tank so as to exert ultrasonic vibrations on the vibration propagating liquid; and a vibration propagating liquid supplying means disposed at a position opposite to the partition wall in the first region of the intermediate tank so as to supply the vibration propagating liquid toward the partition wall;

wherein the vibration propagating liquid flows out from the first region to the second region via the partition wall, wherein the partition wall has an upper portion provided with through holes communicating the first region and second region of the intermediate tank, each of the through holes having a level lower than those of the side walls of the intermediate tank and higher than that of the outer surface of the bottom wall of the cleaning tank; and wherein the vibration propagating liquid flows out from the first region to the second region through the through holes of the partition wall.

11. The cleaning apparatus according to claim 3, wherein the vibration propagating liquid supplying means supplies the vibration propagating liquid toward the outer surface of the bottom wall of the cleaning tank.

12. The cleaning apparatus according to claim 3, wherein the vibration propagating liquid supply means comprises a plurality of nozzles for jetting the vibration propagating liquid.

13. The cleaning apparatus according to claim 5, wherein the vibration propagating liquid supplying means supplies the vibration propagating liquid toward the outer surface of the bottom wall of the cleaning tank.

14. The cleaning apparatus according to claim 5, wherein the vibration propagating liquid supply means comprises a plurality of nozzles for jetting the vibration propagating liquid.

15. The cleaning apparatus according to claim 5, wherein the vibration propagating liquid supplying means supplies the vibration propagating liquid toward the outer surface of the bottom wall of the cleaning tank and wherein the vibration propagating liquid supply means comprises a plurality of nozzles for jetting the vibration propagating liquid.

* * * * *